United States Patent
Chen et al.

(10) Patent No.: US 10,687,417 B2
(45) Date of Patent: Jun. 16, 2020

(54) AIR-COOLING HEAT DISSIPATION DEVICE

(71) Applicant: Microjet Technology Co., Ltd., Hsinchu (TW)

(72) Inventors: Shih-Chang Chen, Hsinchu (TW); Jia-Yu Liao, Hsinchu (TW); Yung-Lung Han, Hsinchu (TW); Chi-Feng Huang, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 15/821,129

(22) Filed: Nov. 22, 2017

(65) Prior Publication Data
US 2018/0146544 A1 May 24, 2018

(30) Foreign Application Priority Data
Nov. 24, 2016 (TW) ............... 105138649 A (51) Int. Cl.
| F28D 15/00 | (2006.01) |
| H05K 1/02 | (2006.01) |
| G06F 1/20 | (2006.01) |
| H05K 7/20 | (2006.01) |

(52) U.S. Cl.
CPC ............ *H05K 1/0272* (2013.01); *G06F 1/20* (2013.01); *H05K 7/20154* (2013.01); *H05K 7/20409* (2013.01); *H05K 7/20918* (2013.01)

(58) Field of Classification Search
CPC .............. H01L 23/467; H05K 7/20136; H05K 7/20145; H05K 7/20154; H05K 7/20172; F04B 43/046; F04B 45/047

USPC .......... 165/80.3, 122, 104.34; 361/695, 697, 361/413.2
See application file for complete search history.

(56) References Cited

U.S. PATENT DOCUMENTS

2018/0146573 A1* 5/2018 Chen .................... F04B 45/047

FOREIGN PATENT DOCUMENTS

| TW | I424805 B | 1/2014 |
| TW | 201430217 A | 8/2014 |
| TW | I487471 B | 6/2015 |
| TW | I551213 B | 9/2016 |

* cited by examiner

*Primary Examiner* — Davis D Hwu
(74) *Attorney, Agent, or Firm* — Birch, Stewart, Kolasch & Birch, LLP (57) ABSTRACT

An air-cooling heat dissipation device is provided for removing heat from an electronic component. The air-cooling heat dissipation device includes a base and an air pump. The base includes a passage, an introduction opening and a discharge opening. The electronic component is covered by the base. The electronic component is disposed within the passage. The air pump is fixed on the base and sealing the edge of the introduction opening. When the air pump is enabled, an ambient air is introduced into the passage through the introduction opening to remove the heat from the electronic component, and the air heated by the electronic component is exhausted through the discharge opening.

6 Claims, 11 Drawing Sheets

AIR-COOLING HEAT DISSIPATION DEVICE

FIELD OF THE INVENTION

The present invention relates to an air-cooling heat dissipation device, and more particularly to an air-cooling heat dissipation device using an air pump to produce an air flow to remove heat.

BACKGROUND OF THE INVENTION

With increasing development of science and technology, the trends of designing electronic devices such as portable computers, tablet computers, industrial computers, portable communication devices or video players are designed toward minimization, easy portability and high performance. Generally, the limited space inside the electronic device is equipped with various high-integration or high-power electronic components for increasing the computing speed and the function of the electronic device, thus generating a great deal of heat during operations. Consequently, the temperature inside the device is increased and high temperature is harmful to the components. Since the electronic device is usually designed as possible as in slim, flat and succinct appearance, it has insufficient inner space for dissipating the waste heat. In case that the heat is not effectively dissipated away, the electronic components of the electronic device are adversely affected by the heat and the high temperature may result in the interference of operation or damaged of the device.

Generally, there are two types of the heat-dissipating mechanisms used in the electronic device to solve such problem, which are known as active heat-dissipating mechanism and passive heat-dissipating mechanism. The active heat-dissipating mechanism is usually presented as an axial fan or a blower, disposed within the electronic device, which can generate an air flow through the space inside the electronic device that dissipating the waste heat. However, the axial fan and the blower are noisy during operation. In addition, they are bulky and have short life span and not suitable to be used in the small-sized, portable electronic device.

On the other hand, electronic components are generally fixed on a printed circuit board (PCB) by means of surface mount technology (SMT) or selective soldering technology. The electronic components would readily come off from the PCB board due to exposure of high temperature. Moreover, most electronic components would be damaged by high temperature. In other words, high temperature not only impairs the stability of performance of the electronic components, but also shortens the life span of the electronic components.

Figure 1:
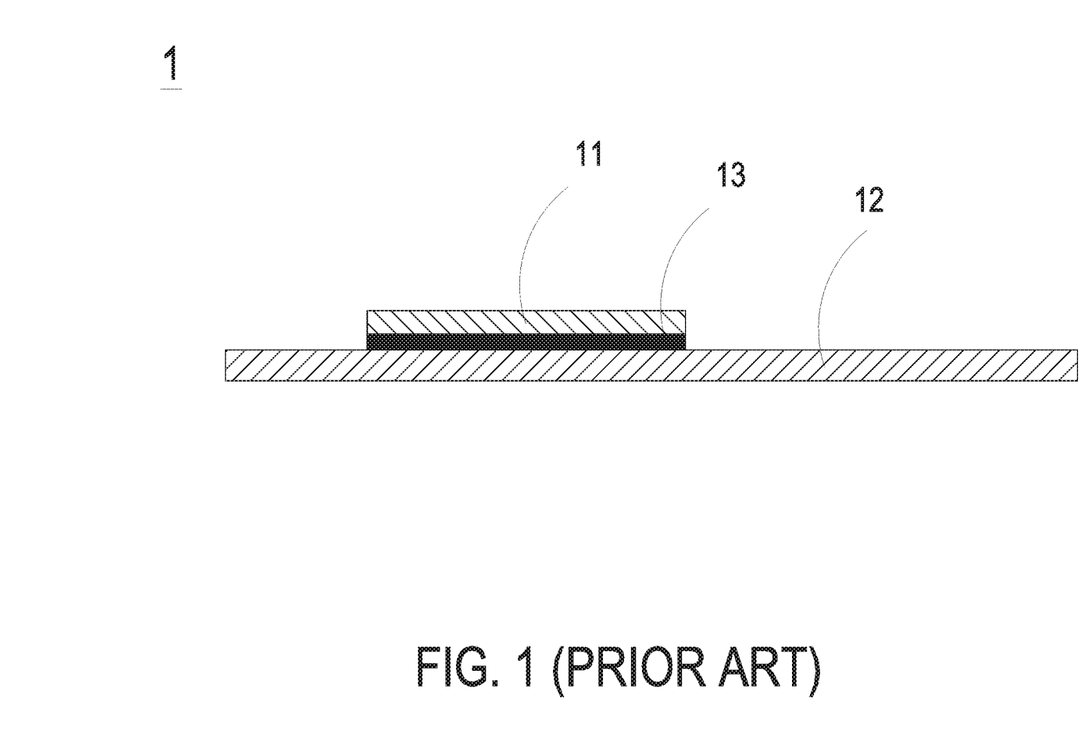
FIG. 1 is a schematic view illustrating a conventional heat-dissipating mechanism.

FIG. 1 is a schematic view illustrating a conventional heat-dissipating mechanism as the passive heat-dissipating mechanism. As shown in FIG. 1, the conventional heat-dissipating mechanism 1 provides a thermal conduction plate 12 attaching on a surface of an electronic component 11 by thermal adhesive 13. Therefore, the thermal adhesive 13 and the thermal conduction plate 12 form a thermal conduction path by which the waste heat generated by the electronic component 11 can be conducted away and then dissipated by convection. However, the heat dissipating efficiency of the conventional heat-dissipating mechanism 1 is usually insufficient, and thus the applications of the conventional heat-dissipating mechanism 1 are limited.

Therefore, there is a need of providing an air-cooling heat dissipation device with improved performance as well as compact size to substitute the conventional technologies.

SUMMARY OF THE INVENTION

An object of the present invention provides an air-cooling heat dissipation device. The air-cooling heat dissipation device is applied to an electronic device to remove heat generated by electronic components of the electronic device. The use of the air-cooling heat dissipation device can increase the heat dissipating efficiency and prevent generating unacceptable noise. Consequently, the performance of the electronic components of the electronic device is stabilized and the life spans of the electronic components are extended.

Another object of the present invention provides an air-cooling heat dissipation device with a temperature controlling function. The operations of an air pump are controlled according to the temperature changes of the electronic components of the electronic device. Consequently, the life span of the air pump is extended.

In accordance with an aspect of the present invention, an air-cooling heat dissipation device is provided for removing heat from an electronic component. The air-cooling heat dissipation device includes a base and an air pump. The base covers the electronic component, and includes a passage, an introduction opening and a discharge opening, wherein the electronic component is disposed within the passage. The air pump is fixed on the base, sealing the edge of the introduction opening. When the air pump is enabled, an ambient air is driven by the air pump and introduced into the passage through the introduction opening, thus generating an air flow in the passage that removing the heat generated by the electronic component. After being heated, the air flow is discharged to surroundings through the discharge opening.

In accordance with another aspect of the present invention, an air-cooling heat dissipation device is provided for removing heat generated by an electronic component. The air-cooling heat dissipation device includes a base, a heat sink and an air pump. The base covers electronic component, and includes a passage, an introduction opening and a discharge opening, wherein the electronic component is disposed within the passage. The heat sink is attached on the electronic component and disposed within the passage as well. The air pump is fixed on the base, sealing the edge of the introduction opening. When the air pump is enabled, an ambient air is driven by the air pump and introduced into the passage through the introduction opening, such that an air flow is generated to remove the heat generated by the electronic component. After being heated, the air flow is discharged to surroundings through the discharge opening.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
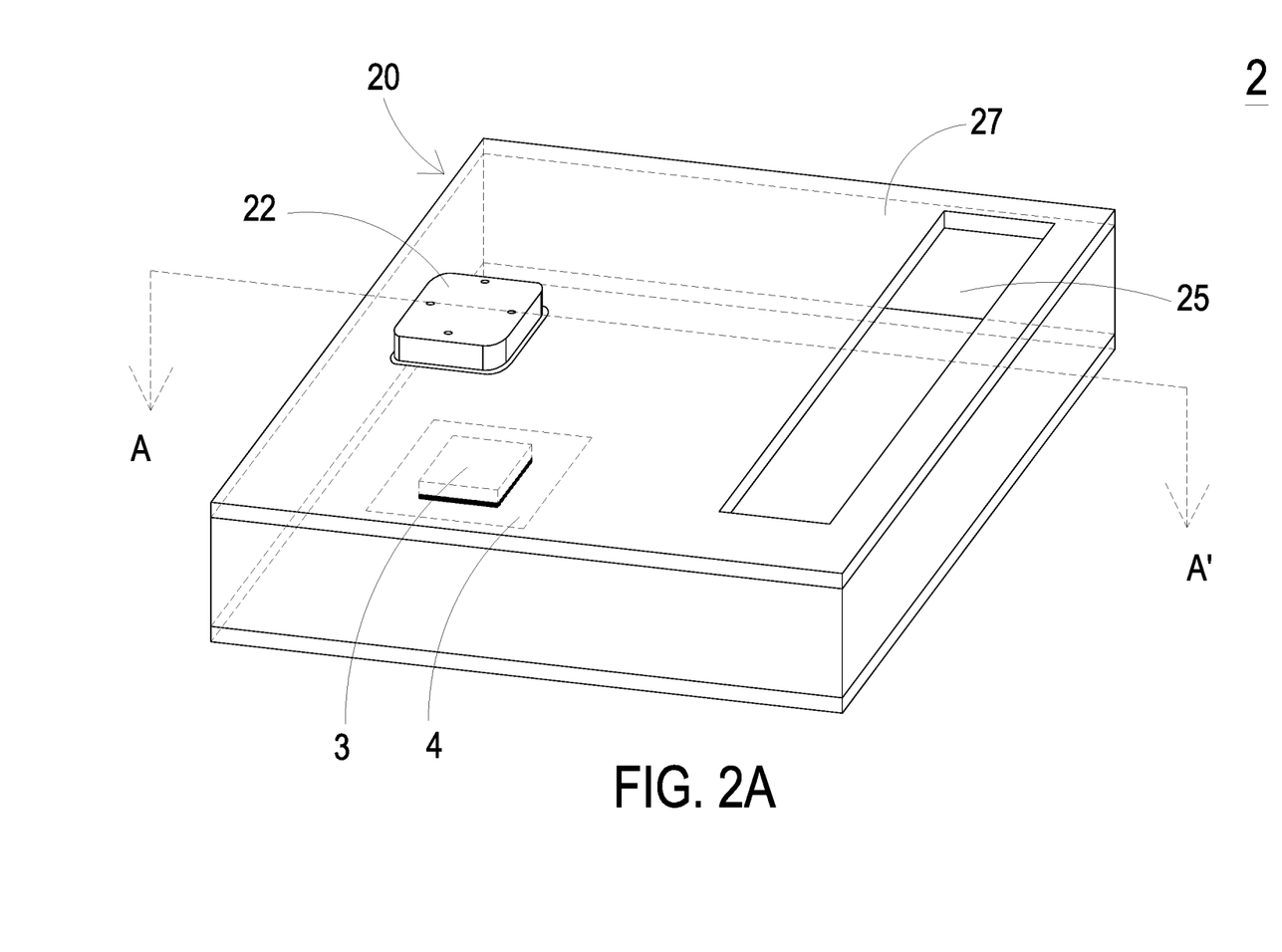
FIG. 2A is a schematic perspective view illustrating the structure of an air-cooling heat dissipation device according to a first embodiment of the present invention.
Figure 2B:
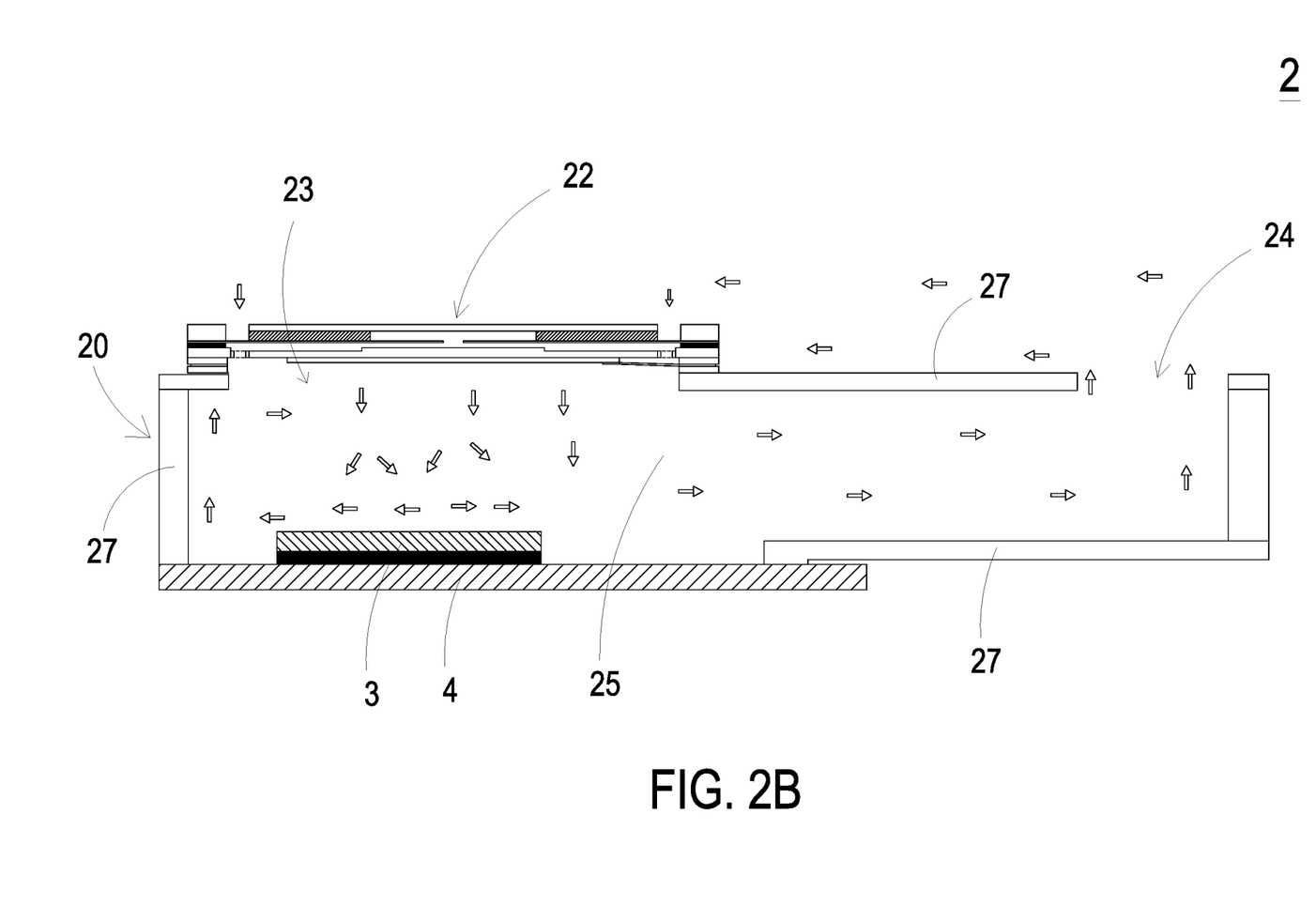
FIG. 2B is a schematic cross-sectional view illustrating the air-cooling heat dissipation device of FIG. 2A and taken along the line AA.

FIG. 2A is a schematic perspective view illustrating the structure of an air-cooling heat dissipation device according to a first embodiment of the present invention. FIG. 2B is a schematic cross-sectional view illustrating the air-cooling heat dissipation device of FIG. 2A and taken along the line AA. The air-cooling heat dissipation device 2 is applied to an electronic device (not shown) to remove the heat generated by an electronic component 3 of the electronic device. An example of the electronic device includes but is not limited to a portable computer, tablet computer, an industrial computer, a portable communication device or video player. The air-cooling heat dissipation device 2 comprises a base 20 and an air pump 22. The base 20 comprises an introduction opening 23, a discharge opening 24 and a passage 25. The electronic component 3 is covered by the base 20, and is disposed within the passage 25. The air pump 22 is fixed on the base 20, sealing the edge of the introduction opening 23. When the air pump 22 is enabled, the ambient air is driven by the air pump 22 and introduced into the passage 25 through the introduction opening 23. Therefore, an air flow is generated and passes through the electronic component 3 in which heat exchange occurs. After being heated, the air flow is discharged to the surroundings through the discharge opening 24. Consequently, the waste heat generated by the electronic component 3 is dissipated away.

The base 20 is a combination of plural thermal insulation plates 27, which define the passage 25, the introduction opening 23 and the discharge opening 24. Preferably, the introduction opening 23 is vertically aligned with the electronic component 3. Moreover, there may be a thermal conduction plate 4 disposed between the electronic component 3 and the thermal insulation plates 27. Therefore, the heat generated by the electronic component 3 can also be dissipated through a thermal conduction path provided by the thermal conduction plate 4. The thermal conduction plate 4 is made of a high thermal conductivity material, which is preferably but not limited to artificial graphite.

According to an embodiment, the air pump 22 is a piezoelectric air pump. During operation of the piezoelectric air pump, the ambient air outside the air-cooling heat dissipation device 2 is continuously introduced into the passage 25 of the base 20, and the air flow keeps flowing through the electronic component 3 in the passage 25, by which the heat is removed as soon as being produced. Thus, high temperature of or around the electronic component 3 is prevented, and the life span and stability of performance of the electronic component 3 are increased.

Figure 3:
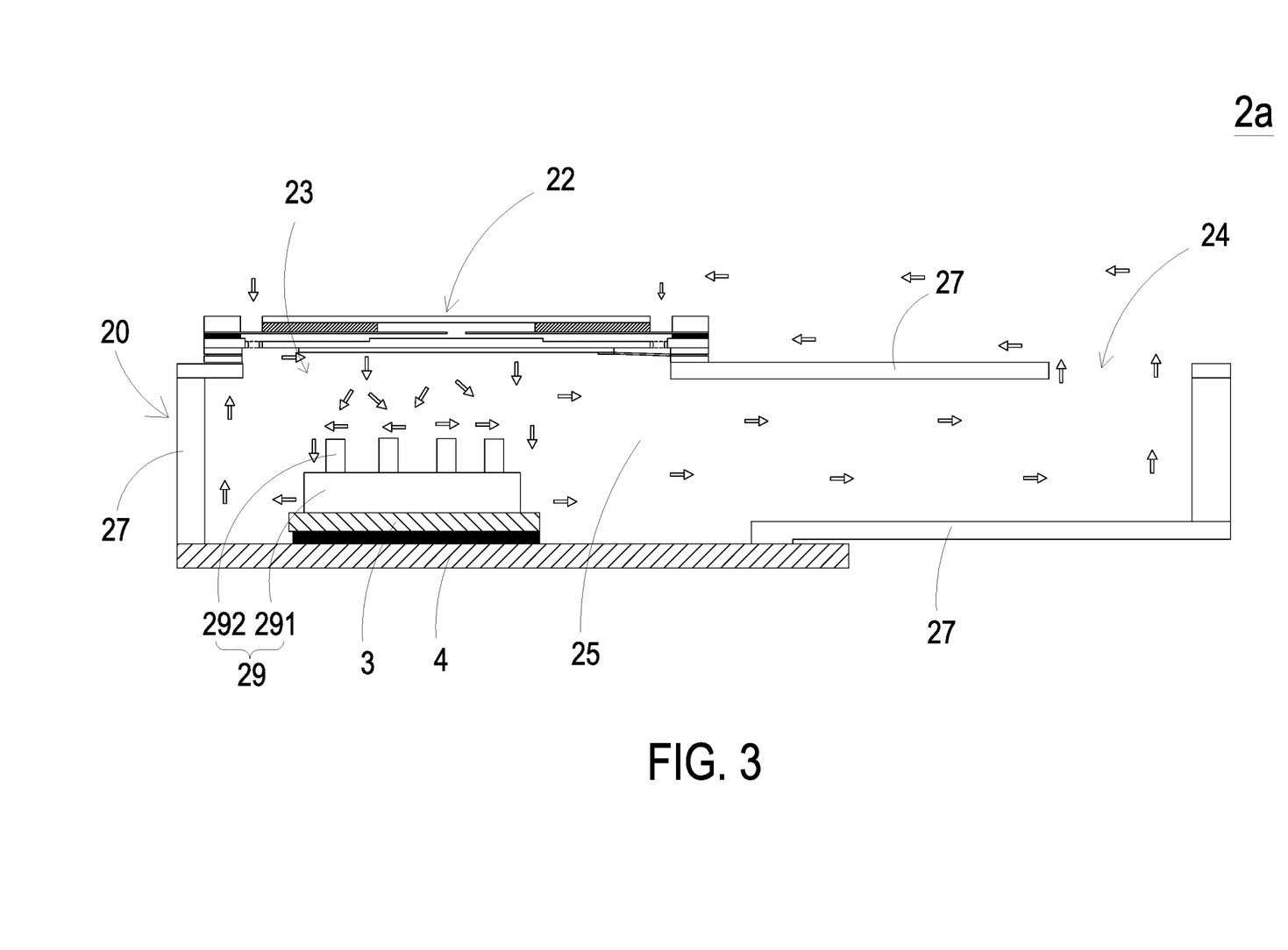
FIG. 3 is a schematic cross-sectional view illustrating an air-cooling heat dissipation device according to a second embodiment of the present invention.

FIG. 3 is a schematic cross-sectional view illustrating an air-cooling heat dissipation device according to a second embodiment of the present invention. Components corresponding to those of the first embodiment are designated by identical numeral references, and detailed descriptions thereof are omitted. In comparison with the air-cooling heat dissipation device 2 of FIG. 2B, the air-cooling heat dissipation device 2a of this embodiment further comprises a heat sink 29. The heat sink 29 is disposed on a surface of the electronic component 3 and disposed within the passage 25. The heat sink 29 is composed of a base plate 291 and plural fins 292. The base plate 291 is attached on the surface of the electronic component 3, and the plural fins 292 are perpendicularly mounted on the base plate 291. The use of the heat sink 29 increases the surface area in contact with the air flow, which accelerates the process of heat exchange. The heat generated by the electronic component 3 is transferred to the heat sink 29 and removed by the air flow in the passage 25. Consequently, the heat dissipating efficacy is further enhanced.

Figure 4A:
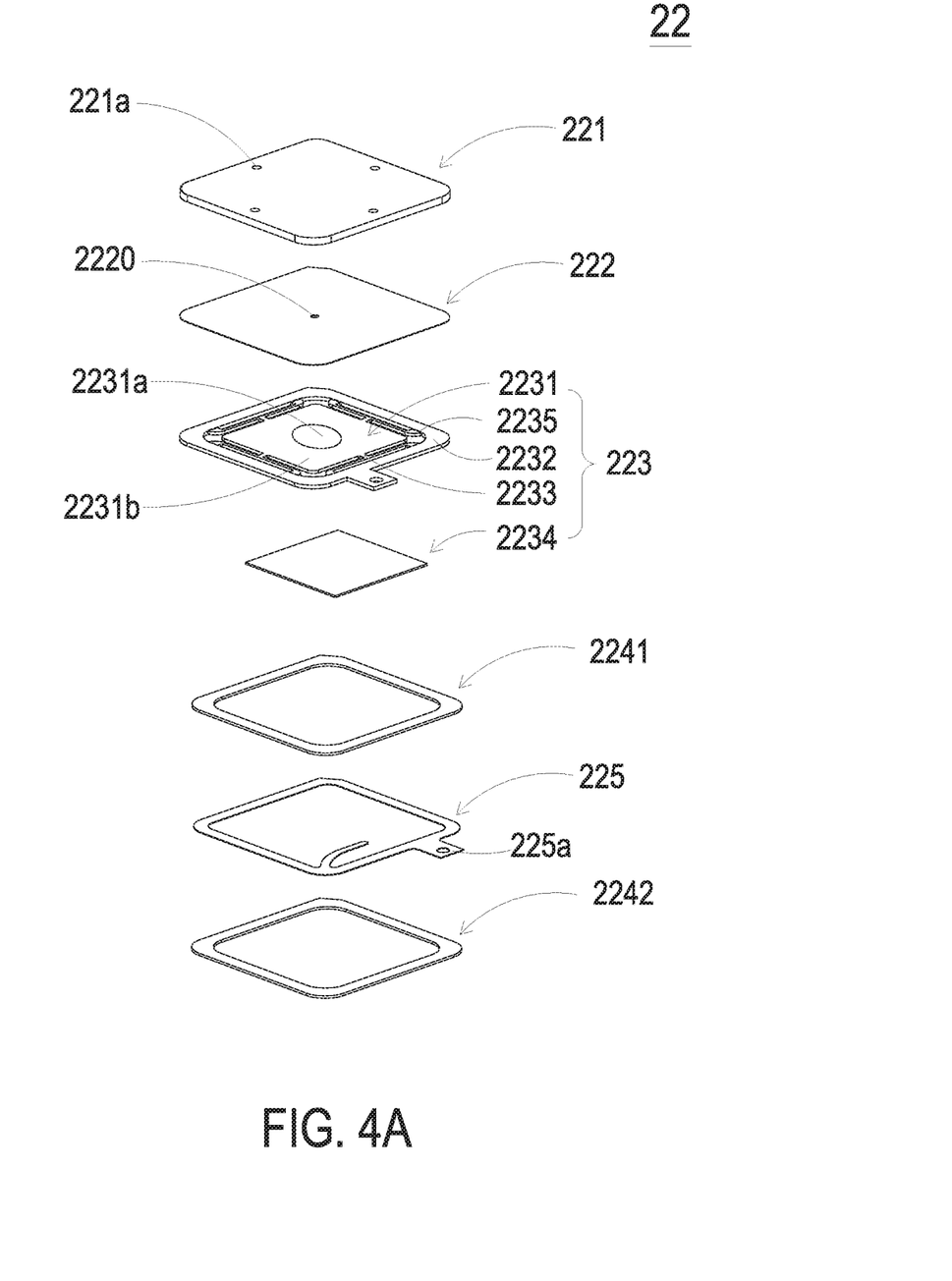
FIG. 4A is a schematic exploded view illustrating an air pump used in the air-cooling heat dissipation device according to an embodiment of the present invention.
Figure 4B:
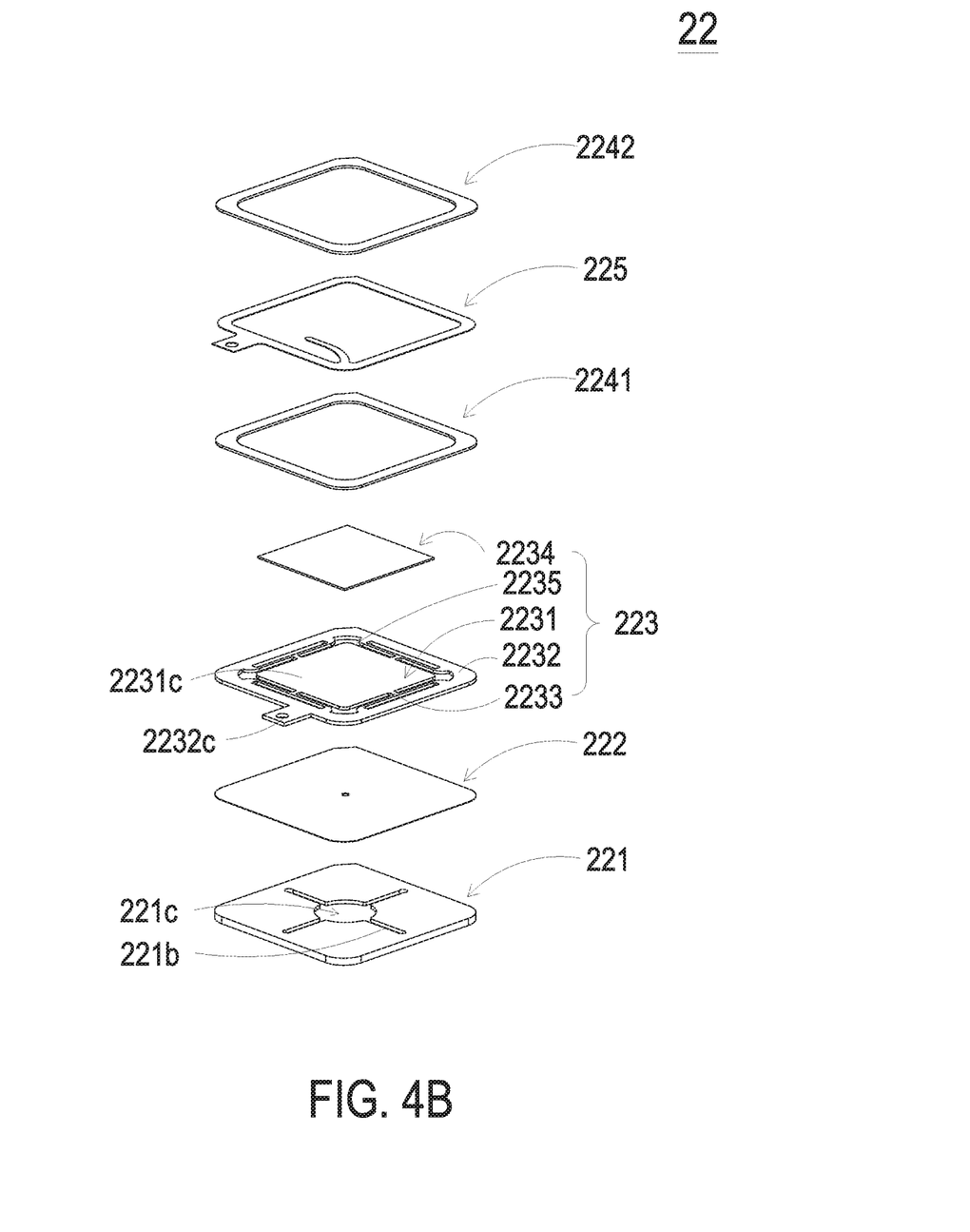
FIG. 4B is a schematic exploded view illustrating the air pump of FIG. 4A and taken along another viewpoint.
Figure 5:
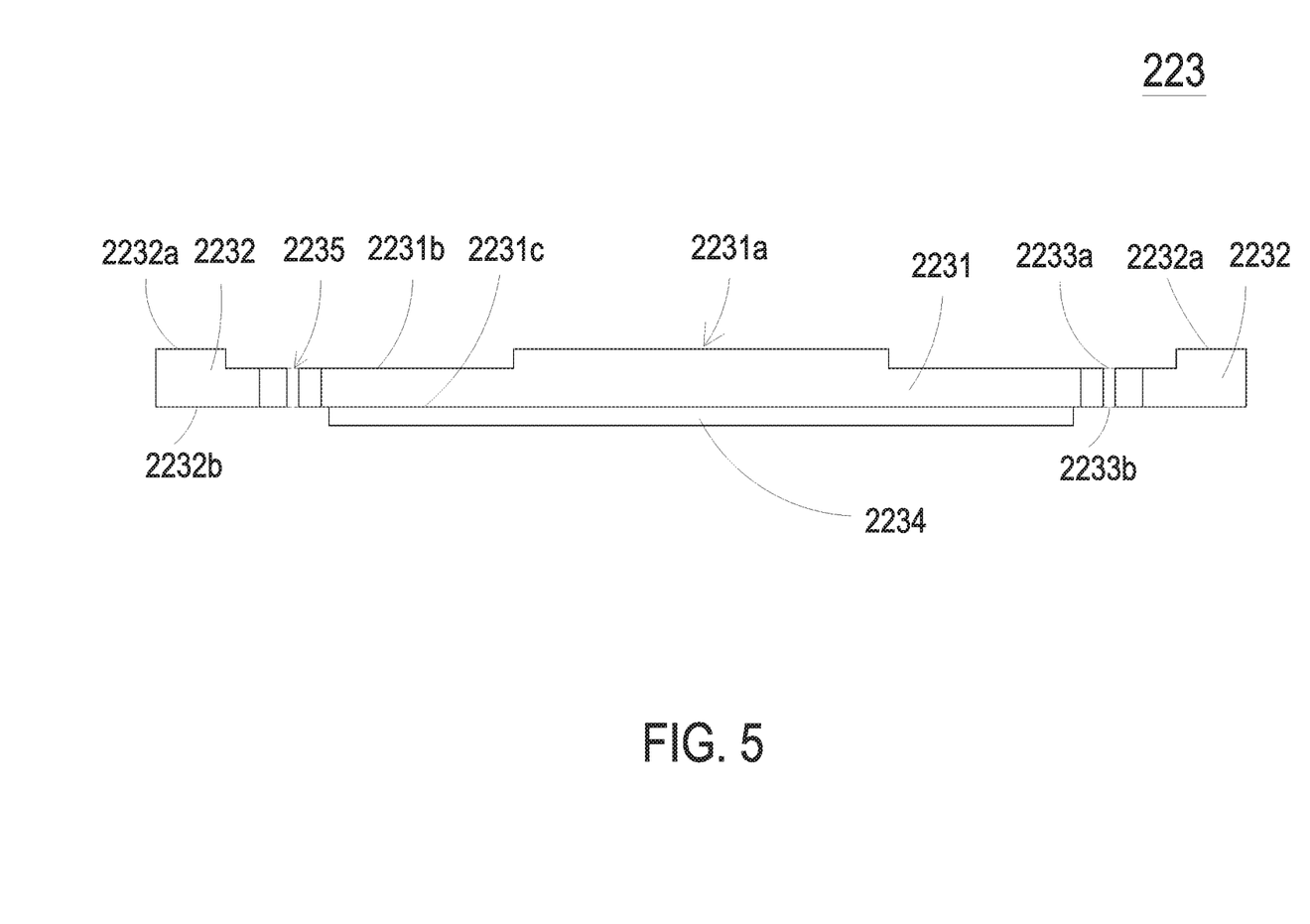
FIG. 5 is a schematic cross-sectional view illustrating a piezoelectric actuator of the air pump as shown in FIGS. 4A and 4B.
Figure 6:
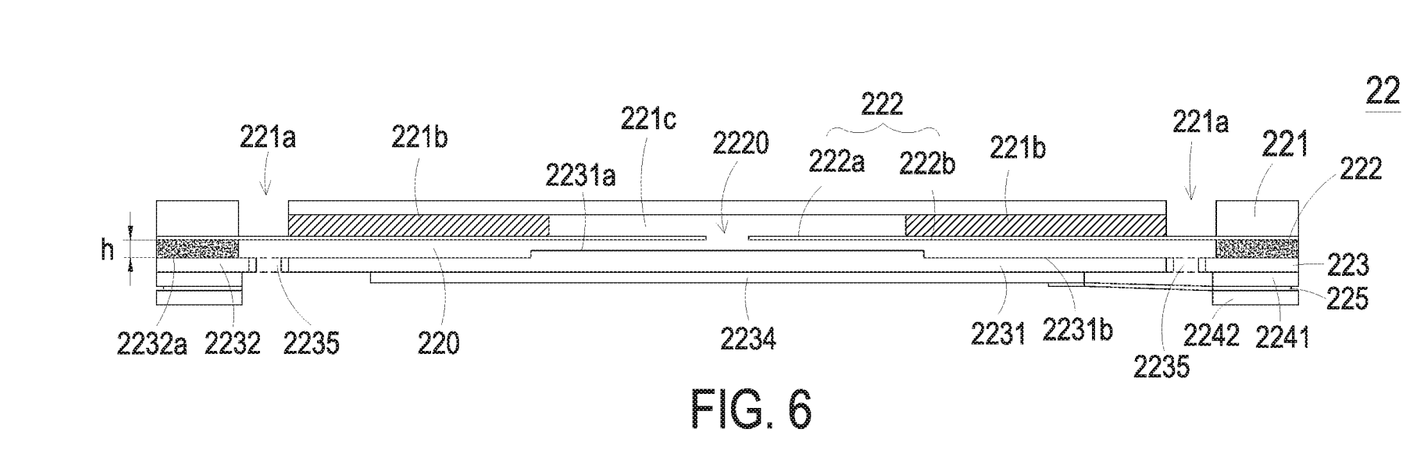
FIG. 6 is a schematic cross-sectional view illustrating the air pump as shown in FIGS. 4A and 4B.

FIG. 4A is a schematic exploded view illustrating an air pump used in the air-cooling heat dissipation device according to an embodiment of the present invention. FIG. 4B is a schematic exploded view illustrating the air pump of FIG. 4A and taken along another viewpoint. FIG. 5 is a schematic cross-sectional view illustrating a piezoelectric actuator of the air pump as shown in FIGS. 4A and 4B. FIG. 6 is a schematic cross-sectional view illustrating the air pump as shown in FIGS. 4A and 4B. Please refer to FIGS. 4A, 4B, 5 and 6. According to an embodiment of the present invention, the air pump 22 is a piezoelectric air pump, comprising a gas inlet plate 221, a resonance plate 222, a piezoelectric actuator 223, a first insulation plate 2241, a conducting plate 225 and a second insulation plate 2242, which are stacked on each other sequentially. The piezoelectric actuator 223 is aligned with the resonance plate 222. After the above components are combined together, the cross-sectional view of the resulting structure of the air pump 22 is shown in FIG. 6.

The gas inlet plate 221 comprises at least one inlet 221a. Preferably but not exclusively, the gas inlet plate 221 comprises four inlets 221a. The inlets 221a run through the gas inlet plate 221. In response to the action of the atmospheric pressure, the air is introduced into the air pump 22 through the inlets 221a. Moreover, at least one convergence channel 221b is formed on a first surface of the gas inlet plate 221, and is in communication with the at least one inlet 221a on a second surface of the gas inlet plate 22. Moreover, a central cavity 221c is located at the intersection of the four convergence channels 221b. The central cavity 221c is in communication with the at least one convergence channel 221b, such that the gas entered by the inlets 221a would be introduced into the at least one convergence channel 221b and is guided to the central cavity 221c. Consequently, the air can be transferred by the air pump 22. In this embodiment, the at least one inlet 221a, the at least one convergence channel 221b and the central cavity 221c of the gas inlet plate 221 are integrally formed. The central cavity 221c is a convergence chamber for temporarily storing the air. Preferably but not exclusively, the gas inlet plate 221 is made of stainless steel. In some embodiments, the depth of the convergence chamber defined by the central cavity 221c is equal to the depth of the at least one convergence channel 221b. The resonance plate 222 is made of a flexible material, which is preferably but not exclusively copper. The resonance plate 222 further has a central aperture 2220 corresponding to the central cavity 221c of the gas inlet plate 221 that providing the gas for flowing through.

The piezoelectric actuator 223 comprises a suspension plate 2231, an outer frame 2232, at least one bracket 2233 and a piezoelectric plate 2234. The piezoelectric plate 2234 is attached on a first surface 2231c of the suspension plate 2231. In response to an applied voltage, the piezoelectric plate 2234 would be subjected to a deformation. When the piezoelectric plate 2233 is subjected to the deformation, the suspension plate 2231 is subjected to a curvy vibration. The at least one bracket 2233 is connected between the suspension plate 2231 and the outer frame 2232, while the two ends of the bracket 2233 are connected with the outer frame 2232 and the suspension plate 2231 respectively that the bracket 2233 can elastically support the suspension plate 2231. At least one vacant space 2235 is formed between the bracket 2233, the suspension plate 2231 and the outer frame 2232. The at least one vacant space 2235 is in communication with the introduction opening 23 for allowing the air to go through. The type of the suspension plate 2231 and the outer frame 2232, and the type and the number of the at least one bracket 2233 may be varied according to the practical requirements. The outer frame 2232 is arranged around the suspension plate 2231. Moreover, a conducting pin 2232c is protruding outwardly from the outer frame 2232 so as to be electrically connected with an external circuit (not shown).

As shown in FIG. 5, the suspension plate 2231 has a bulge 2231a that makes the suspension plate 2231 a stepped structure. The bulge 2231a is formed on a second surface 2231b of the suspension plate 2231. The bulge 2231b may be a circular convex structure. A top surface of the bulge 2231a of the suspension plate 2231 is coplanar with a second surface 2232a of the outer frame 2232, while the second surface 2231b of the suspension plate 2231 is coplanar with a second surface 2233a of the bracket 2233. Moreover, there is a drop of specified amount from the bulge 2231a of the suspension plate 2231 (or the second surface 2232a of the outer frame 2232) to the second surface 2231b of the suspension plate 2231 (or the second surface 2233a of the bracket 2233). A first surface 2231c of the suspension plate 2231, a first surface 2232b of the outer frame 2232 and a first surface 2233b of the bracket 2233 are coplanar with each other. The piezoelectric plate 2234 is attached on the first surface 2231c of the suspension plate 2231. The suspension plate 2231 may be a square plate structure with two flat surfaces but the type of the suspension plate 2231 may be varied according to the practical requirements. In this embodiment, the suspension plate 2231, the at least bracket 2233 and the outer frame 2232 are integrally formed and produced by using a metal plate (e.g., a stainless steel plate). In an embodiment, the length of the piezoelectric plate 2234 is smaller than the length of the suspension plate 2231. In another embodiment, the length of the piezoelectric plate 2234 is equal to the length of the suspension plate 2231. Similarly, the piezoelectric plate 2234 is a square plate structure corresponding to the suspension plate 2231.

In the air pump 22, the first insulation plate 2241, the conducting plate 225 and the second insulation plate 2242 are stacked on each other sequentially and located under the piezoelectric actuator 223. The profiles of the first insulation plate 2241, the conducting plate 225 and the second insulation plate 2242 substantially match the profile of the outer frame 2232 of the piezoelectric actuator 223. The first insulation plate 2241 and the second insulation plate 2242 are made of an insulating material (e.g. a plastic material) for providing insulating efficacy. The conducting plate 225 is made of an electrically conductive material (e.g. a metallic material) for providing electrically conducting efficacy. Moreover, the conducting plate 225 has a conducting pin 225a so as to be electrically connected with an external circuit (not shown).

In an embodiment, the gas inlet plate 221, the resonance plate 222, the piezoelectric actuator 223, the first insulation plate 2241, the conducting plate 225 and the second insulation plate 2242 of the air pump 22 are stacked on each other sequentially. Moreover, there is a gap h between the resonance plate 222 and the outer frame 2232 of the piezoelectric actuator 223, which is formed and maintained by a filler (e.g. a conductive adhesive) inserted therein in this embodiment. The gap h ensures the proper distance between the bulge 2231a of the suspension plate 2231 and the resonance plate 222, so that the contact interference is reduced and the generated noise is largely reduced. In some embodiments, the height of the outer frame 2232 of the piezoelectric actuator 223 is increased, so that the gap is formed between the resonance plate 222 and the piezoelectric actuator 223.

After the gas inlet plate 221, the resonance plate 222 and the piezoelectric actuator 223 are combined together, a movable part 222a and a fixed part 222b of the resonance plate 222 are defined. A convergence chamber for converging the air is defined by the movable part 222a of the resonance plate 222 and the gas inlet plate 211 collaboratively. Moreover, a first chamber 220 is formed between the resonance plate 222 and the piezoelectric actuator 223 for temporarily storing the air. Through the central aperture 2220 of the resonance plate 222, the first chamber 220 is in communication with the central cavity 221c of the gas inlet plate 221. The peripheral regions of the first chamber 220 are in communication with the underlying introduction opening 23 through the vacant space 2235 between the brackets 2233 of the piezoelectric actuator 223.

FIGS. 7A to 7E schematically illustrate the actions of the air pump of FIGS. 4A and 4B. Please refer to FIGS. 6 and 7A to 7E. The actions of the air pump will be described as follows. When the air pump 22 is enabled, the piezoelectric actuator 223 is vibrated along a vertical direction in a reciprocating manner by using the bracket 2233 as the fulcrums. The resonance plate 222 except for the part of it fixed on the gas inlet plate 221 is hereinafter referred as a movable part 222a, while the rest is referred as a fixed part 222b. Since the resonance plate 222 is light and thin, the movable part 222a vibrates along with the piezoelectric actuator 223 because of the resonance of the piezoelectric actuator 223. In other words, the movable part 222a is reciprocated and subjected to a curvy deformation. When the piezoelectric actuator 223 is vibrated downwardly, the movable part 222a of the resonance plate 222 is subjected to the curvy deformation because the movable part 222a of the resonance plate 222 is pushed by the air and vibrated in response to the piezoelectric actuator 223. In response to the downward vibration of the piezoelectric actuator 223, the air is fed into the at least one inlet 221a of the gas inlet plate 221. Then, the air is transferred to the central cavity 221c of the gas inlet plate 221 through the at least one convergence channel 221b. Then, the air is transferred through the central aperture 2220 of the resonance plate 222 corresponding to the central cavity 221c, and introduced downwardly into the first chamber 220. As the piezoelectric actuator 223 is enabled, the resonance of the resonance plate 222 occurs. Consequently, the resonance plate 222 is also vibrated along the vertical direction in the reciprocating manner.

Figure 7A:
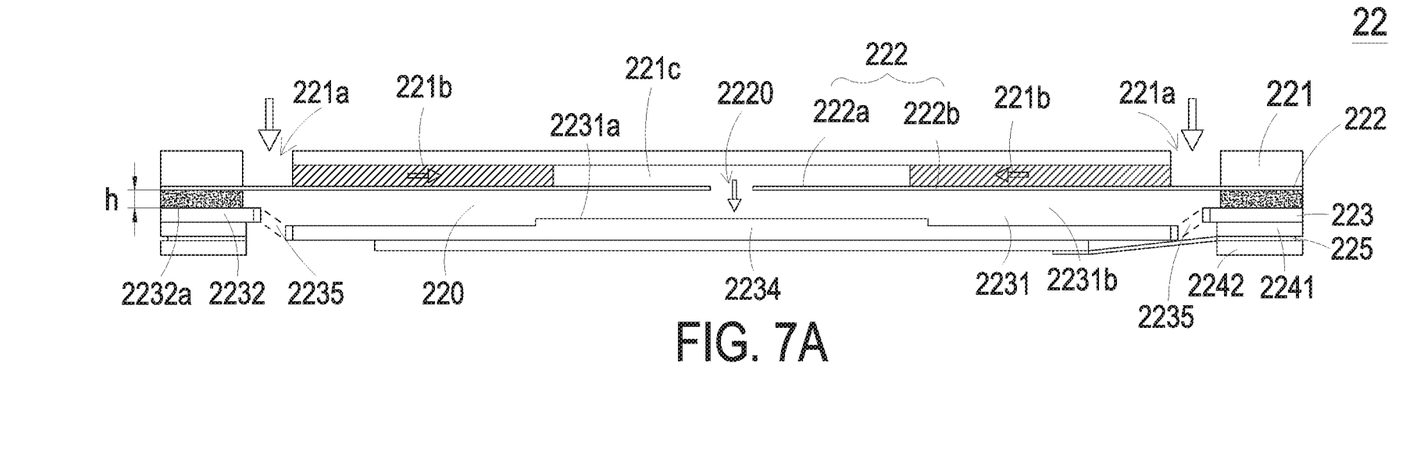
FIGS. 7A to 7E schematically illustrate the actions of the air pump of FIGS. 4A and 4B.
Figure 7B:
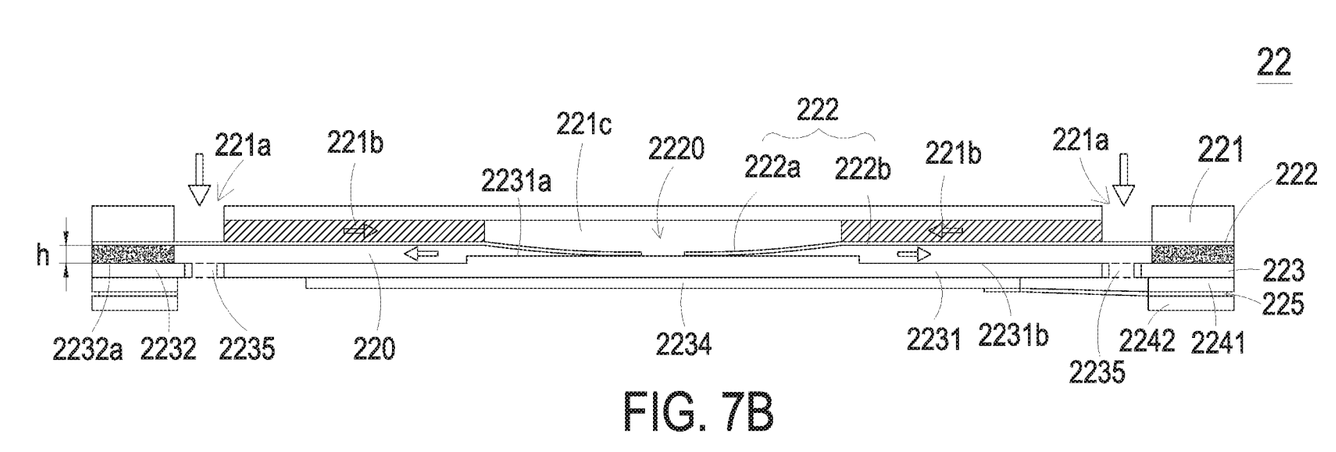

As shown in FIG. 7B, during the vibration of the movable part 222a of the resonance plate 222, the movable part 222a moves down till bring contacted with the bulge 2231a of the suspension plate 2231. In the meantime, the volume of the first chamber 220 is shrunken and a middle space which was communicating with the convergence chamber is closed. Under this circumstance, the pressure gradient occurs to push the air in the first chamber 121 moving toward peripheral regions of the first chamber 220 and flowing downwardly through the vacant spaces 2235 of the piezoelectric actuator 223.

Figure 7C:
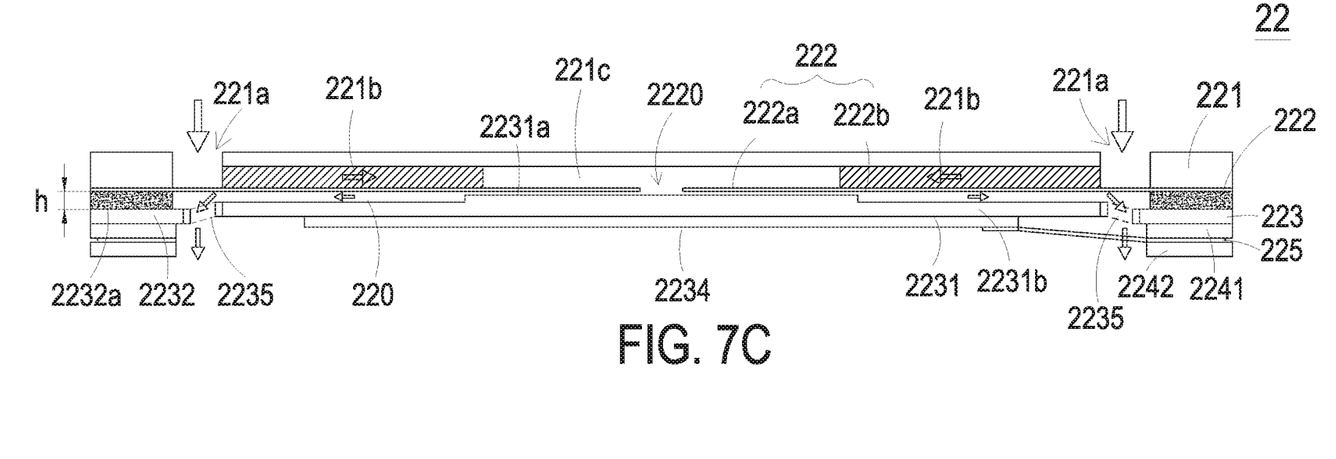

Please refer to FIG. 7C, which illustrates consecutive action following the action in FIG. 7B. The movable part 222a of the resonance plate 222 has returned its original position when, the piezoelectric actuator 223 has ascended at a vibration displacement to an upward position. Consequently, the volume of the first chamber 220 is consecutively shrunken that generating the pressure gradient which makes the air in the first chamber 220 continuously pushed toward peripheral regions. Meanwhile, the air continuously fed into the inlets 221a of the gas inlet plate 221 and transferred to the central cavity 221c.

Figure 7D:
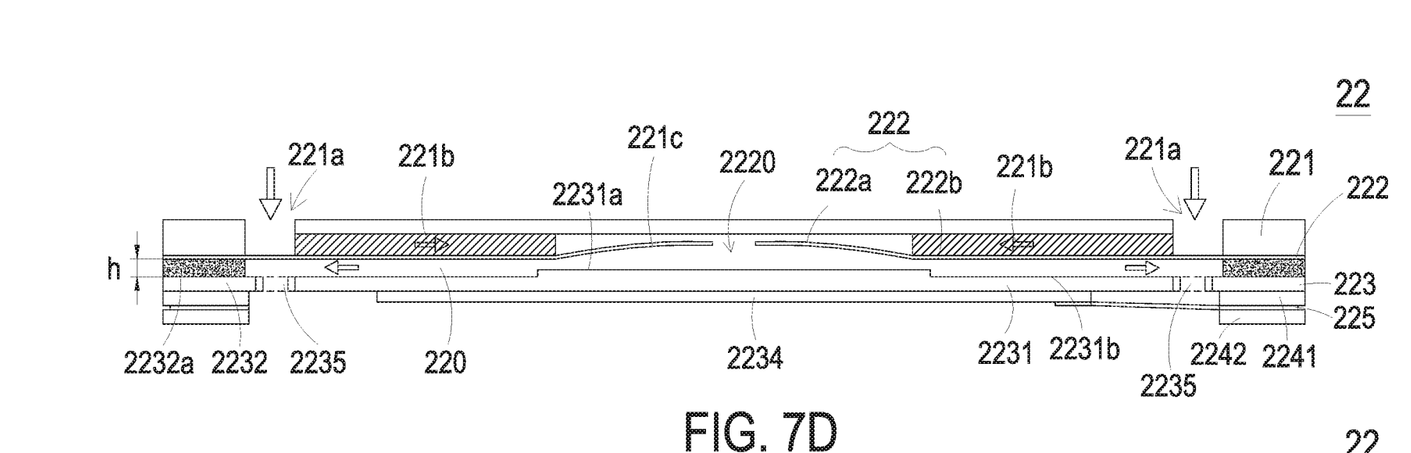

Then, as shown in FIG. 7D, the resonance plate 222 moves upwardly, which is caused by the resonance of the upward motion of the piezoelectric actuator 223. Consequently, the air is slowly fed into the inlets 221a of the gas inlet plate 221, and transferred to the central cavity 221c.

Figure 7E:
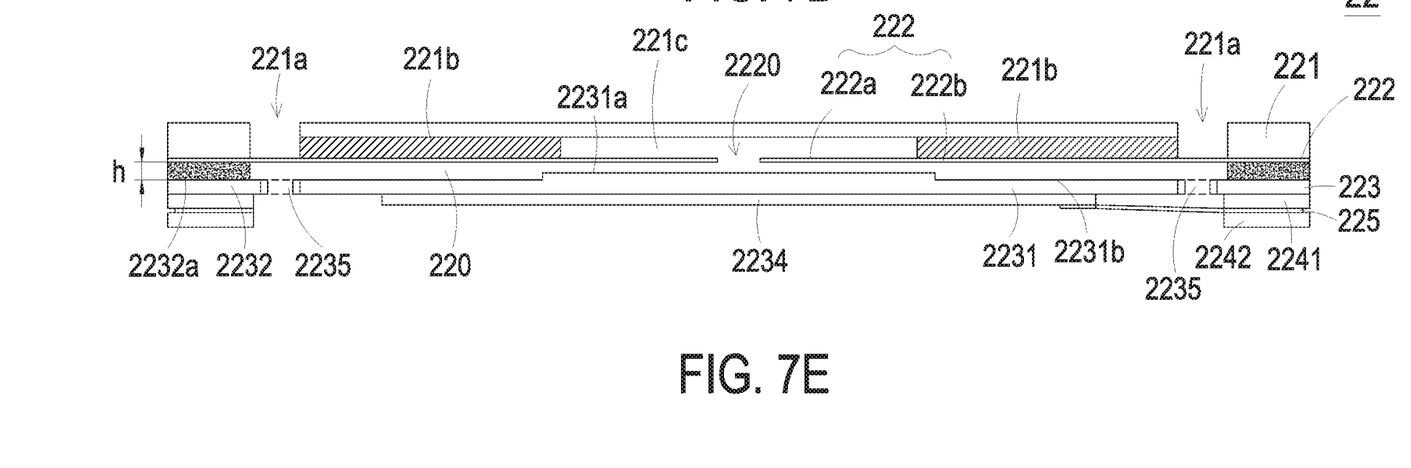

As shown in FIG. 7E, the movable part 222a of the resonance plate 222 has returned its original position. When the resonance plate 222 is vibrated along the vertical direction in the reciprocating manner, the gap h between the resonance plate 222 and the piezoelectric actuator 223 providing space for vibration of the resonance plate 222. That is, the thickness of the gap h affects the amplitude of vibration of the resonance plate 12. Consequently, a pressure gradient is generated in the fluid channels of the air pump 22 to facilitate the air to flow at a high speed. Moreover, since there is an impedance difference between the feeding direction and the exiting direction, the air can be transmitted from the inlet side to the outlet side. Moreover, even if the outlet side has a gas pressure, the air pump 22 still has the capability of pushing the air to the first airflow-guiding chamber 200 while achieving the silent efficacy.

The steps of FIGS. 7A to 7E are repeatedly done. Consequently, the ambient air is transferred by the air pump 22 from the outside to the inside.

As mentioned above, the operation of the air pump 22 can guide the air into the passage 25. The heat generated by the electronic component 3 is continuously removed by the air flow formed by introduced air, which is pushed by the air pump 22 and flowing fast in the passage 25. The heated air flow is exhausted to the surroundings of the air-cooling heat dissipation device 2 through the discharge opening 24. Through such disposition, the heat dissipating efficiency is enhanced, and the performance stability and the life span of the electronic component 3 are increased.

Figure 8:
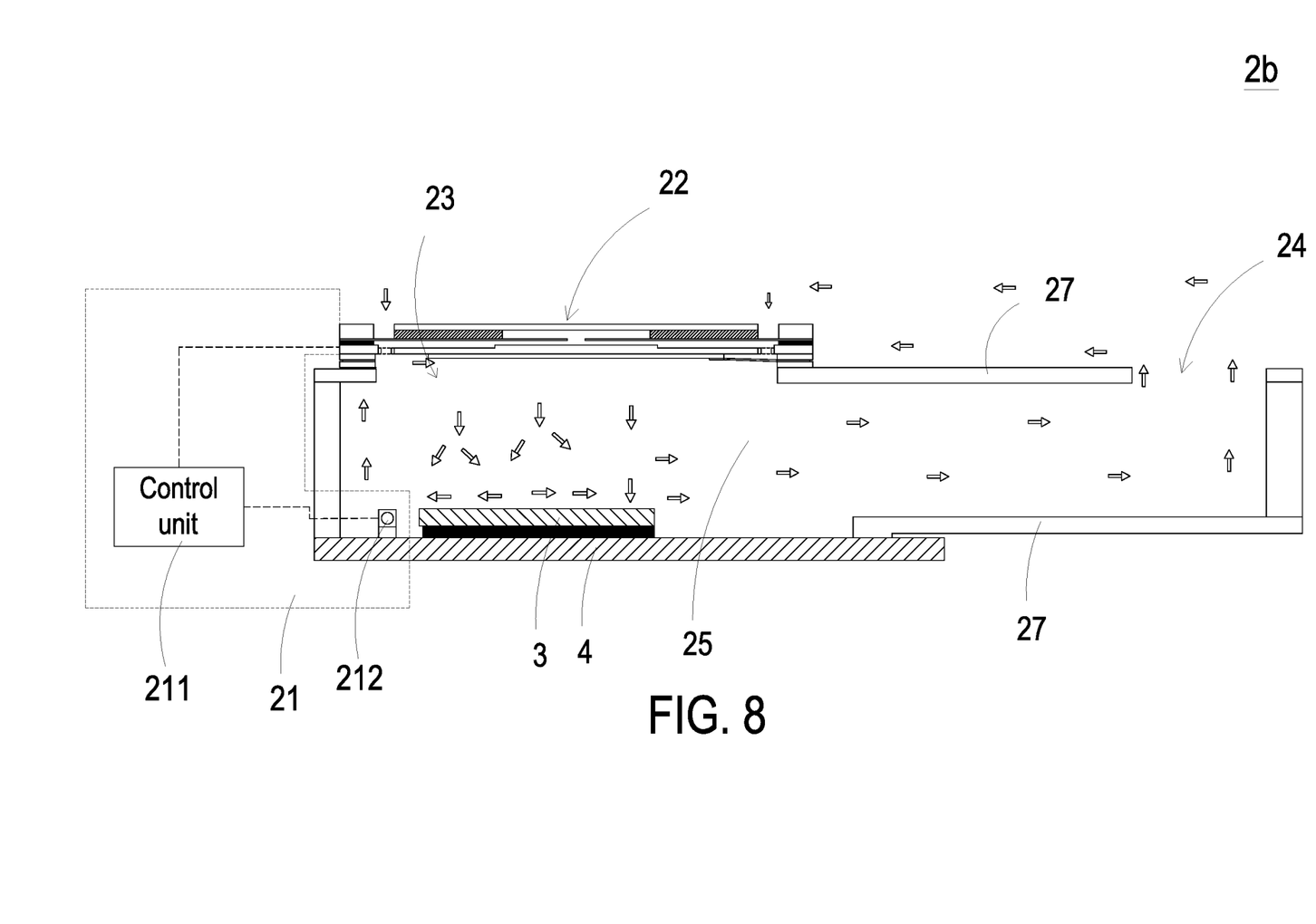
FIG. 8 is a schematic cross-sectional view illustrating an air-cooling heat dissipation device according to a third embodiment of the present invention.

FIG. 8 is a schematic cross-sectional view illustrating an air-cooling heat dissipation device according to a third embodiment of the present invention. Components corresponding to those of the first embodiment are designated by identical numeral references, and detailed descriptions thereof are omitted. In comparison with the air-cooling heat dissipation device 2 of FIG. 2B, the air-cooling heat dissipation device 2b of this embodiment further provides a temperature controlling function. According to this embodiment, the air-cooling heat dissipation device 2b further comprises a control system 21 composed of a control unit 211 and a temperature sensor 212. The control unit 211 is electrically connected with the air pump 22 to control the operation of the air pump 22. The temperature sensor 212 may be disposed within the base 20 and located near the electronic component 3 so as to detect ambient temperature of the electronic component 3. Alternatively, the temperature sensor 212 may be directly attached on the electronic component 3 so as to detect the temperature thereof. The temperature sensor 212 is electrically connected with the control unit 211 to which the detected temperature as a detecting signal is transmitted. After receiving the detecting signal, the control unit 211 determines whether the detected temperature is higher than a pre-determined threshold value. If the detected temperature is determined higher than or equal to the threshold value, the control unit 211 enables the air pump 22; oppositely, if the detected temperature is determined lower than the threshold value, the control unit 211 disables the air pump 22. As so, the air pump 22 operates only when high temperature is detected, thus the life span of the air pump 22 can be prolonged.

From the above descriptions, the present invention provides an air-cooling heat dissipation device with compact size that is suitable to be applied to a wide variety of portable electronic devices to remove heat generated by electronic components thereof as well as keeping the electronic devices in slim profile. Moreover, the heat is dissipated away more efficiently and the noise during operation is reduced in comparison of the conventional techniques.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air-cooling heat dissipation device for removing heat from an electronic component, the air-cooling heat dissipation device comprising:
   a thermal conduction plate attaching on the electronic component,
   a base comprising a passage, an introduction opening and a discharge opening, wherein the electronic component is covered by the base and disposed within the passage, wherein the base is a combination of plural thermal insulation plates, and the passage, the introduction opening and the discharge opening are defined by the plural thermal insulation plates collaboratively, and the introduction opening is facing the electronic component; and
   a piezoelectric air pump fixed on the base and sealing the edge of the introduction opening and comprising:
      a gas inlet plate comprising at least one inlet, at least one convergence channel and a central cavity, wherein a convergence chamber is defined by the central cavity, and the at least one convergence channel corresponds to the at least one inlet, wherein after the air is introduced into the at least one convergence channel through the at least one inlet, the air is guided by the at least one convergence channel and converged to the convergence chamber;

a resonance plate having a central aperture, wherein the central aperture is aligned with the convergence chamber, wherein the resonance plate comprises a movable part near the central aperture; and a piezoelectric actuator aligned with the resonance plate, wherein a gap is formed between the resonance plate and the piezoelectric actuator to define a first chamber, wherein when the piezoelectric actuator is enabled, the air is fed into the piezoelectric air pump through the at least one inlet of the gas inlet plate, converged to the central cavity through the at least one convergence channel, transferred through the central aperture of the resonance plate, and introduced into the first chamber, wherein the air is further transferred through a resonance between the piezoelectric actuator and the movable part of the resonance plate;

wherein when the piezoelectric air pump is enabled, an ambient air is introduced into the passage such that an air flow is generated to remove heat from the electronic component, after which the heated air flow is discharged through the discharge opening, wherein the top surface of the thermal conduction plate is lower than the top surface of the thermal insulation plate disposed at the bottom of the base.

2. The air-cooling heat dissipation device according to claim 1, wherein the piezoelectric actuator comprises:
   a suspension plate having a first surface and an opposing second surface, wherein the suspension plate is permitted to undergo a curvy vibration;
   an outer frame arranged around the suspension plate;
   at least one bracket connected between the suspension plate and the outer frame for elastically supporting the suspension plate; and
   a piezoelectric plate, wherein a length of the piezoelectric plate is smaller than or equal to a length of the suspension plate, and the piezoelectric plate is attached on the first surface of the suspension plate, wherein when a voltage is applied to the piezoelectric plate, the suspension plate is driven to undergo the curvy vibration.

3. The air-cooling heat dissipation device according to claim 2, wherein the suspension plate is a square suspension plate having a bulge formed on the second surface.

4. The air-cooling heat dissipation device according to claim 1, wherein the piezoelectric air pump further comprises a conducting plate, a first insulation plate and a second insulation plate, wherein the gas inlet plate, the resonance plate, the first insulation plate, the conducting plate and the second insulation plate are stacked on each other sequentially.

5. The air-cooling heat dissipation device according to claim 1, further comprising a control system, wherein the control system comprises:
   a control unit electrically connected with the piezoelectric air pump for controlling operations of the piezoelectric air pump; and
   a temperature sensor electrically connected with the control unit and located near the electronic component, wherein the temperature sensor detects a temperature of the electronic component and generates a corresponding detecting signal to the control unit, wherein the control unit obtains the temperature of the electronic component according to the detecting signal, wherein if the control unit determines the temperature of the electronic component is higher than or equal to a threshold value, the control unit enables the piezoelectric air pump to generate the air flow, wherein if the control unit determines the temperature of the electronic component is lower than the threshold value, the control unit disables the piezoelectric air pump.

6. An air-cooling heat dissipation device for removing heat from an electronic component, the air-cooling heat dissipation device comprising:
   a thermal conduction plate attaching on the electronic component;
   a base comprising an passage, an introduction opening and a discharge opening, wherein the electronic component is covered by the base, and the electronic component is disposed within the passage, wherein the base is a combination of plural thermal insulation plates, and the passage, the introduction opening and the discharge opening are defined by the plural thermal insulation plates collaboratively, and the introduction opening is facing the electronic component;
   a heat sink attached on the electronic component and disposed within the passage; and
   a piezoelectric air pump fixed on the base and sealing the edge of the introduction opening and comprising:
      a gas inlet plate comprising at least one inlet, at least one convergence channel and a central cavity, wherein a convergence chamber is defined by the central cavity, and the at least one convergence channel corresponds to the at least one inlet, wherein after the air is introduced into the at least one convergence channel through the at least one inlet, the air is guided by the at least one convergence channel and converged to the convergence chamber;
      a resonance plate having a central aperture, wherein the central aperture is aligned with the convergence chamber, wherein the resonance plate comprises a movable part near the central aperture; and
      a piezoelectric actuator aligned with the resonance plate, wherein a gap is formed between the resonance plate and the piezoelectric actuator to define a first chamber, wherein when the piezoelectric actuator is enabled, the air is fed into the piezoelectric air pump through the at least one inlet of the gas inlet plate, converged to the central cavity through the at least one convergence channel, transferred through the central aperture of the resonance plate, and introduced into the first chamber, wherein the air is further transferred through a resonance between the piezoelectric actuator and the movable part of the resonance plate;

wherein when the piezoelectric air pump is enabled, an ambient air is introduced into the passage through the introduction opening such that an air flow is generated to remove the heat from the electronic component, and the heated air flow is discharged through the discharge opening, wherein the top surface of the thermal conduction plate is lower than the top surface of the thermal insulation plate disposed at the bottom of the base.

* * * * *